United States Patent
Roh et al.

(10) Patent No.: US 9,444,489 B2
(45) Date of Patent: Sep. 13, 2016

(54) DELTA-SIGMA MODULATOR HAVING DIFFERENTIAL OUTPUT

(71) Applicants: SAMSUNG ELECTRONICS CO., LTD., Suwon-si (KR); Industry-University Cooperation Foundation Hanyang University ERICA Campus, Ansan-si (KR)

(72) Inventors: Jeongjin Roh, Ansan-si (KR); Jong Pal Kim, Seoul (KR); Youngjae Jung, Ansan-si (KR); Quanzhen Duan, Ansan-si (KR); Tak Hyung Lee, Suwon-si (KR); Danbi Choi, Ansan-si (KR)

(73) Assignees: Samsung Electronics Co., Ltd., Suwon-si (KR); Industry-University Cooperation Foundation Hanyang University ERICA Campus, Ansan-si (KR)

( * ) Notice: Subject to any disclaimer, the term of this patent is extended or adjusted under 35 U.S.C. 154(b) by 0 days.

(21) Appl. No.: 14/805,628

(22) Filed: Jul. 22, 2015

(65) Prior Publication Data

US 2016/0149586 A1 May 26, 2016

(30) Foreign Application Priority Data

Nov. 24, 2014 (KR) .................. 10-2014-0164693

(51) Int. Cl.
*H03M 3/00* (2006.01)
*G06G 7/184* (2006.01)

(52) U.S. Cl.
CPC ............... *H03M 3/39* (2013.01); *G06G 7/184* (2013.01); *H03M 3/30* (2013.01); *H03M 3/458* (2013.01)

(58) Field of Classification Search
CPC ........ H03M 3/39; H03M 3/30; H03M 3/458; G06G 7/184

USPC .................................................. 341/143, 155
See application file for complete search history.

(56) References Cited

U.S. PATENT DOCUMENTS

| | | | |
|---|---|---|---|
| 4,588,981 A | 5/1986 | Senn | |
| 5,729,232 A | 3/1998 | Fujimori | |
| 6,147,522 A | 11/2000 | Rhode et al. | |
| 6,498,573 B2 * | 12/2002 | Laaser | H03M 3/32 341/143 |
| 7,304,592 B2 * | 12/2007 | Pinna | H03M 3/332 341/143 |
| 7,495,589 B1 * | 2/2009 | Trifonov | H03M 1/1019 341/118 |
| 8,199,038 B2 * | 6/2012 | Kim | G06G 7/186 327/344 |
| 8,339,299 B2 | 12/2012 | Quiquempoix et al. | |
| 8,937,567 B2 * | 1/2015 | Obata | H03F 3/45076 341/143 |
| 2006/0139192 A1 | 6/2006 | Morrow et al. | |
| 2006/0244650 A1 | 11/2006 | Oprescu | |
| 2007/0069939 A1 | 3/2007 | Felder et al. | |
| 2010/0019944 A1 | 1/2010 | Oliaei et al. | |
| 2010/0103014 A1 | 4/2010 | Quiquempoix et al. | |
| 2013/0057421 A1 | 3/2013 | Aruga et al. | |

FOREIGN PATENT DOCUMENTS

JP 2014-060489 A 4/2014
KR 10-1999-0071152 A 9/1999

* cited by examiner

*Primary Examiner* — Brian Young
(74) *Attorney, Agent, or Firm* — NSIP Law

(57) ABSTRACT

Provided is a delta-sigma modulator having a differential output, the modulator including a switched-capacitor integrator configured to generate a non-inverted integral signal and an inverted integral signal and also including a switched-capacitor circuit configured to sample an input signal based on a control signal and to integrate the feedback signal and the input signal based on the control signal and also a feedback circuit configured to generate the feedback signal.

31 Claims, 13 Drawing Sheets

DELTA-SIGMA MODULATOR HAVING DIFFERENTIAL OUTPUT

CROSS-REFERENCE TO RELATED APPLICATION(S)

This application claims the benefit under 35 USC 119(a) of Korean Patent Application No. 10-2014-0164693 filed on Nov. 24, 2014 in the Korean Intellectual Property Office, the entire disclosure of which is incorporated herein by reference for all purposes.

BACKGROUND

1. Field

The following description relates to a delta-sigma modulator. The following description further relates to a delta-sigma modulator having a differential output.

2. Description of Related Art

In general, a signal may be more easily processed in a digital form, rather than an analog form. For this reason, research has been continuously conducted relating to converting an analog signal into a digital signal. Once the analog signal is in digital form, it is represented in discrete form rather than a spectrum of continuous values, making the signal easier to process.

A process of converting the analog signal into the digital signal may also be referred to as an analog-to-digital conversion. An accuracy of the digital signal converted from the analog signal may be a significant aspect of the analog-to-digital conversion. Such an accuracy plays a significant role because if the digital representation of the analog signal is inaccurate, there may be large discrepancies and errors introduced into processing the signal as a result of the conversion.

A delta-sigma analog-to-digital converter (ADC) may oversample an analog input signal, convert the oversampled analog input signal into a one-bit digital bitstream through a delta-sigma modulation, and generate multi-bit digital data based on the one-bit digital bitstream.

In some ADC approaches, an analog signal is sampled with a sampling frequency and subsequently quantized using a multi-level quantizer to produce a digital signal. However, this process adds quantization error noise to the signal. In delta-sigma modulation, first, delta modulation is performed, so that the delta or change in a signal is coded instead of its absolute value. After the delta modulation, the signal becomes a stream of pulses. In delta-sigma module, the modulated stream is made even more accurate by passing the output throughout a 1-bit DAC and performing a sigma, or addition, operation to add the resulting analog signal to the input signal, and this reduces the error resulting from the delta-modulation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a switched-capacitor integrator includes an amplifier including a first input terminal, a second input terminal, a first output terminal, and a second output terminal, a first integrating capacitor situated between the first input terminal and the first output terminal, a second integrating capacitor situated between the second input terminal and the second output terminal, and a switched-capacitor circuit configured to sample an input signal based on a control signal, and configured to integrate the input signal and a feedback signal using the first integrating capacitor and the second integrating capacitor based on the control signal.

The first output terminal may be configured to output a non-inverted output signal, and the second output terminal may be configured to output an inverted output signal.

The integrator may further include a feedback circuit configured to generate the feedback signal by sampling a reference signal using a feedback capacitor, and to transfer the feedback signal into the switched-capacitor circuit.

The reference signal may include a non-inverted reference signal and an inverted reference signal, and the feedback circuit may be configured to generate the feedback signal by sampling at least one of the non-inverted reference signal and the inverted reference signal based on the control signal.

The feedback circuit may include a first feedback circuit configured to generate a first feedback signal based on the reference signal, and to transfer the first feedback signal into the first integrating capacitor, and a second feedback circuit configured to generate a second feedback signal based on the reference signal, and to transfer the second feedback signal into the second integrating capacitor.

The control signal may include a first control signal used to control the switched-capacitor circuit and a second control signal used to control the feedback circuit, and the second control signal may be generated based on the first control signal.

The first control signal may be generated based on an output signal of the first output terminal and an output signal of the second output terminal.

The switched-capacitor circuit may include a first sampling capacitor configured to integrate the input signal using the first integrating capacitor, a second sampling capacitor configured to integrate the input signal using the second integrating capacitor, and an array of switches controlled based on a clock phase of the control signal.

The array of switches may be controlled based on the clock phase such that the input signal is transmitted into at least one of the first sampling capacitor and the second sampling capacitor, and an output signal of the first sampling capacitor may be integrated using the first integrating capacitor while the output signal of the first sampling capacitor is simultaneously integrated using the second integrating capacitor.

The clock phase may include a first clock phase in which the input signal is sampled using the first sampling capacitor, and a second clock phase in which an output signal of the first sampling capacitor and an output signal of a first feedback capacitor are integrated using the first integrating capacitor, and an output signal of the second sampling capacitor and an output signal of a second feedback capacitor are integrated using the second integrating capacitor.

In another general aspect, a delta-sigma modulator includes a digital-to-analog converter (DAC) configured to generate a feedback signal using a reference signal, and a switched-capacitor integrator configured to sample an input signal based on a control signal and integrate the feedback signal and the input signal based on the control signal, thereby generating a non-inverted integral signal and an inverted integral signal.

The modulator may further include a comparator configured to generate an L-bit digital bitstream based on the non-inverted integral signal and the inverted integral signal, wherein L is a natural number.

The switched-capacitor integrator may include an amplifier including a first input terminal, a second input terminal, a first output terminal, and a second output terminal, a first integrating capacitor situated between the first input terminal and the first output terminal, a second integrating capacitor situated between the second input terminal and the second output terminal, a switched-capacitor circuit configured to sample the input signal based on the control signal, and configured to integrate the input signal and the feedback signal using the first integrating capacitor and the second integrating capacitor based on the control signal, and a feedback circuit configured to generate the feedback signal by sampling the reference signal using a feedback capacitor, and to transfer the feedback signal into the switched-capacitor circuit.

The feedback signal may include a non-inverted feedback signal and an inverted feedback signal, and the feedback circuit may be configured to transfer at least one of the non-inverted feedback signal and the inverted feedback signal to the switched-capacitor circuit based on the control signal.

The control signal may include a first control signal used to control the switched-capacitor circuit and a second control signal used to control the feedback circuit, and the second control signal may be generated based on the first control signal.

The first control signal may be generated based on an output signal output from the first output terminal and an output signal of the second output terminal.

The switched-capacitor circuit may include an array of switches controlled based on a clock phase of the control signal such that the input signal is transmitted into at least one of a first sampling capacitor and a second sampling capacitor, and an output signal of the first sampling capacitor is integrated using the first integrating capacitor while the output signal of the first sampling capacitor is simultaneously integrated using the second integrating capacitor.

In another general aspect, an operation method of a switched-capacitor integrator includes sampling an input signal based on a clock phase of a control signal, and generating a non-inverted integral signal and an inverted integral signal by integrating the input signal and a feedback signal using the clock phase of the control signal.

In another general aspect, an operation method of a delta-sigma modulator includes generating a feedback signal using a reference signal, sampling an input signal based on a control signal, and generating a non-inverted integral signal and an inverted integral signal by integrating the input signal and the feedback signal based on the control signal.

The sampling and generating may be performed based on a clock phase of the control signal.

The generating the feedback signal may include sampling a reference signal using a feedback capacitor.

The reference signal may include a non-inverted reference signal and an inverted reference signal, and the generating may include sampling the feedback signal by sampling at least one of the non-inverted reference signal and the inverted reference signal based on the control signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
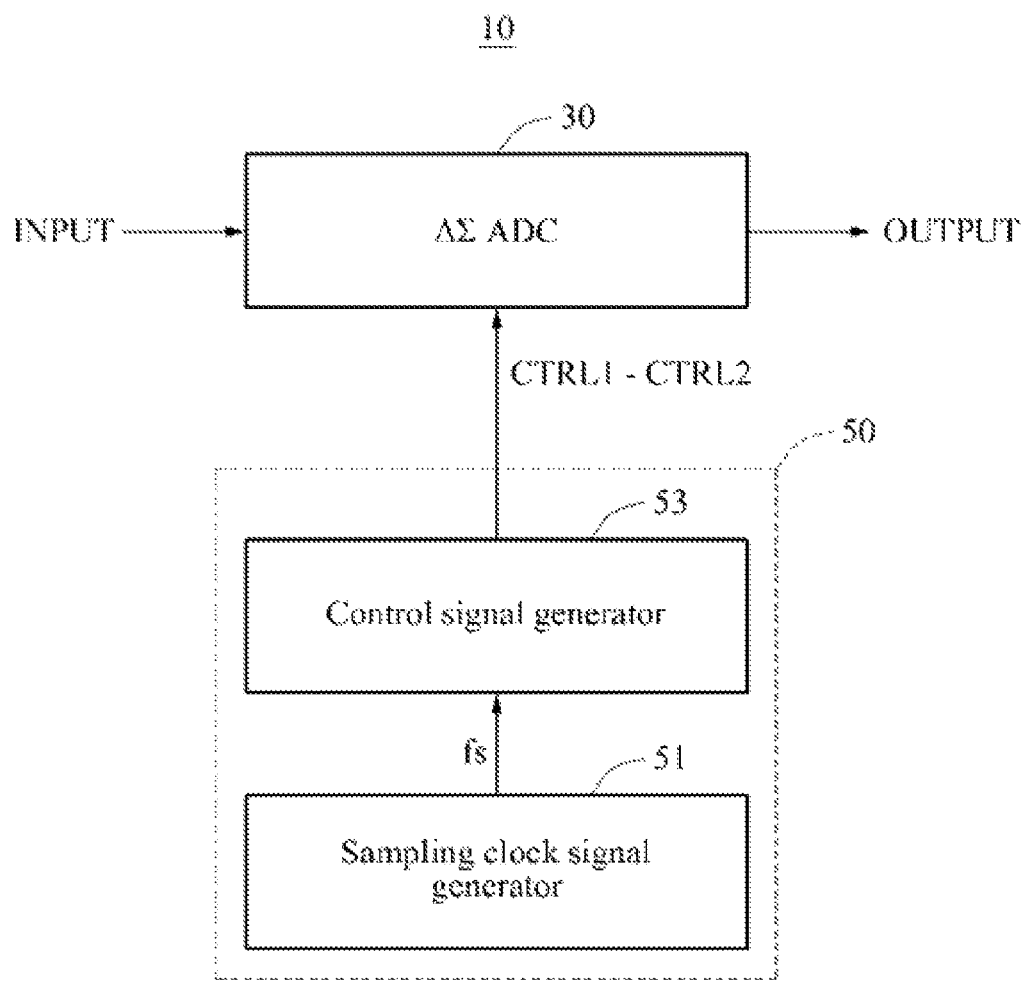
FIG. 1 illustrates an example of an electronic system including a delta-sigma analog-to-digital converter (ADC).

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, various examples are described further with reference to the accompanying drawings.

It is intended to be understood, however, that there is no intent to limit this disclosure to the particular examples disclosed. On the contrary, examples are to include all modifications, equivalents, and alternatives falling within the scope of the examples and their possible variations. As discussed above, like numbers refer to like elements throughout the description of the figures.

The terminology used herein is for the purpose of describing particular examples only and is not intended to be limiting. As used herein, the singular forms "a," "an" and "the" are intended to include the plural forms as well, unless the context clearly indicates otherwise. It is intended to be further understood that the terms "include" and/or "have,"

when used in this specification, specify the presence of stated features, integers, steps, operations, elements, components or combinations thereof, but do not preclude the presence or addition of one or more other features, integers, steps, operations, elements, components, and/or groups thereof, where appropriate.

Unless otherwise defined, all terms including technical and scientific terms used herein are intended to have the same meaning as is commonly understood by one of ordinary skill in the art to which these examples pertain. It is intended to be further understood that terms, such as those defined in commonly used dictionaries, are intended to be interpreted as having a meaning that is consistent with their meaning in the context of the relevant art and are not intended to be interpreted in an idealized or overly formal sense unless expressly so defined herein.

Regarding the reference numerals assigned to the elements in the drawings, it is to be noted that the same elements are designated by the same reference numerals, wherever possible, even though they are shown in different drawings. Also, in the descriptions of examples, detailed description of well-known related structures or functions are omitted when such description would otherwise cause ambiguous interpretation of the present examples. Additionally, repetitive discussions of similar features of various examples are omitted for brevity.

FIG. 1 illustrates an electronic system 10 including a delta-sigma analog-to-digital converter (ADC) 30.

Referring to the example of FIG. 1, the electronic system 10 includes the delta-sigma ADC 30 and a signal generation circuit 50.

In various examples, the electronic system 10 is implemented as, for example, a personal computer (PC), a data server, and a portable electronic device. In various examples where the electronic system 10 is implemented as a portable electronic device, the portable electronic device is implemented as, for example, a laptop computer, a mobile phone, a smartphone, a tablet PC, a mobile internet device (MID), a personal digital assistant (PDA), an enterprise digital assistant (EDA), a digital still camera, a digital video camera, a portable multimedia player (PMP), a personal navigation device or portable navigation device (PND), a handheld game console, and an e-book. However, these are only examples of types of devices that are used as the electronic system 10, and alternatives are possible, where such an electronic system 10 is based around an electronic device, such as other devices that use a processor to process information in the context of an electronic device.

In the example of FIG. 1, the delta-sigma ADC 30 samples an input signal, for example, INPUT. In this example, the delta-sigma ADC 30 performs the sampling in response to control signals, for example, CTRL1 and CTRL2, that are output from the signal generation circuit 50. For example, the delta-sigma ADC 30 integrates the input signal and a feedback signal in response to the control signals. In such an example, the delta-sigma ADC 30 generates a non-inverted integral signal and an inverted integral signal. Thus, the delta-sigma ADC 30 generates a digital signal, for example, OUTPUT, corresponding to the input signal based on a result of the integrating, and output the generated digital signal for further processing. For example, the delta-sigma ADC 30 generates multi-bit digital data corresponding to the input signal based on the result of the integrating, and outputs the generated multi-bit digital data as the digital signal. In such an example, the input signal is an analog signal. Here, the delta-sigma ADC 30 processes such an analog signal to produce a digital version of the signal for subsequent processing.

In the example of FIG. 1, the signal generation circuit 50 generates the control signals. In this example, the signal generation circuit 50 includes a sampling clock signal generator 51 and a control signal generator 53. For example, the sampling clock signal generator 51 generates a sampling signal, for example, fs, having a sampling frequency, and outputs the generated sampling signal to the control signal generator 53. After receiving the sampling signal, the control signal generator 53 generates the control signals in response to the sampling signal. The control signal generator 53 outputs the generated control signals to the delta-sigma ADC 30.

Although FIG. 1 illustrates the signal generation circuit 50 as being disposed externally to the delta-sigma ADC 30, it is to be understood that in another example, the signal generation circuit 50 is disposed internally to the delta-sigma ADC 30 depending on an example. Alternatively, part of the signal generation circuit 50 is included in the delta-sigma ADC 30, and part of the signal generation circuit 50 is disposed externally to the delta-sigma ADC 30.

Figure 2:
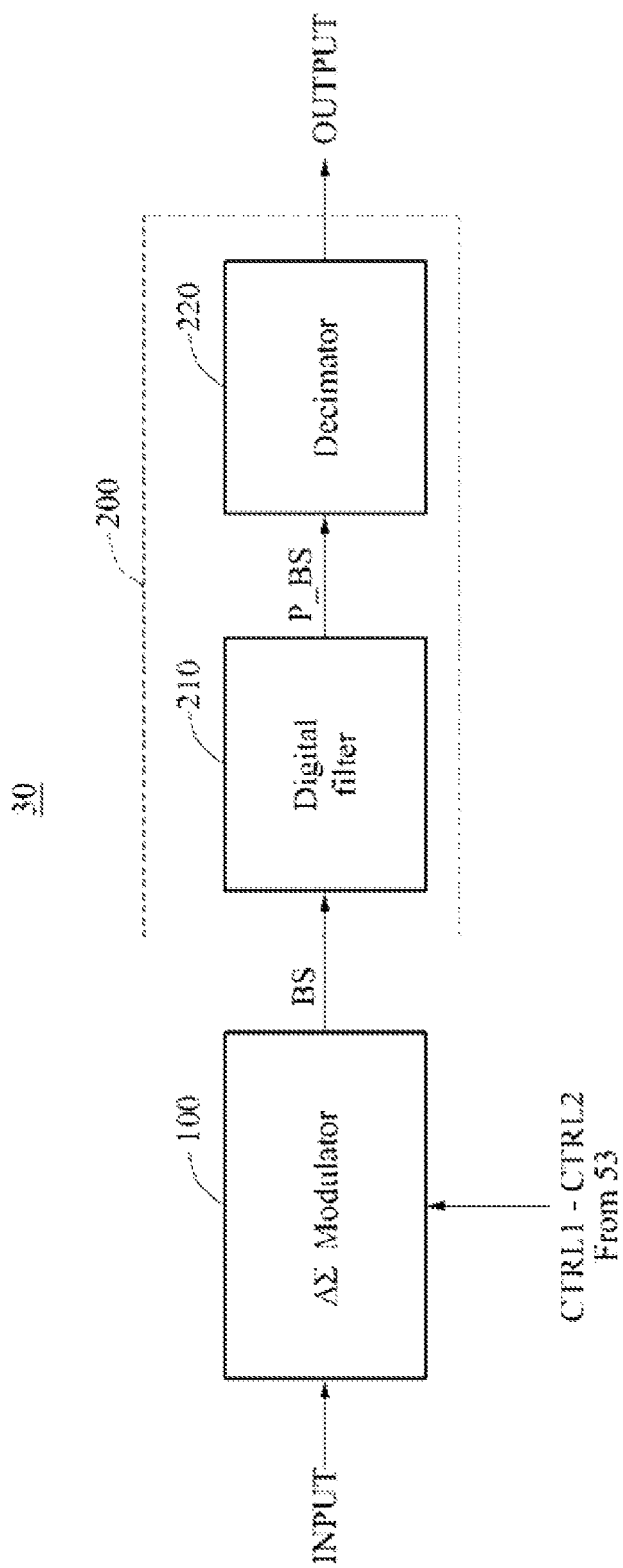
FIG. 2 illustrates an example of the delta-sigma ADC of FIG. 1.

FIG. 2 illustrates an example of the delta-sigma ADC 30 of FIG. 1.

Referring to the example of FIG. 2, the delta-sigma ADC 30 includes a delta-sigma modulator 100 and a decimation filter 200.

According to the example of FIG. 2, the delta-sigma modulator 100 samples an input signal, for example, INPUT, in response to control signals, for example, CTRL1 and CTRL2, where the control signals are output from the control signal generator 53 of the signal generation circuit 50, as discussed further previously. Furthermore, the delta-sigma modulator 100 integrates the input signal and a feedback signal in response to the control signals. Based on a result of the integration, the delta-sigma modulator 100 generates an L-bit digital bitstream, for example, BS, L being a natural number. Subsequently, the delta-sigma modulator 100 outputs the generated L-bit digital bitstream to the decimation filter 200. The result of the integrating includes a non-inverted integral signal and an inverted integral signal.

The decimation filter 200 generates a digital signal, for example, OUTPUT. The digital signal OUTPUT corresponds to the input signal, based on the result of the integrating. For example, the decimation filter 200 generates multi-bit digital data corresponding to the input signal based on the L-bit digital bitstream, and outputs the generated multi-bit digital data as the digital signal. To help process the digital data in this manner, in the example of FIG. 2, the decimation filter 200 includes a digital filter 210 and a decimator 230.

In such an example, the digital filter 210 receives the L-bit digital bitstream and processes the received L-bit digital bitstream. For example, the digital filter 210 reduces high-frequency components or noise included in the L-bit digital bitstream. In another example, the digital filter 210 extracts low-frequency components included in the L-bit digital bitstream using a low-pass digital filter. The digital filter 210 processes the L-bit digital bitstream, and outputs the processed L-bit digital bitstream to the decimator 230.

The decimator 230 receive a processed digital bitstream, for example, P_BS, from the digital filter 210. The decimator 230 then converts the processed digital bitstream into multi-bit digital data. Thus, the decimator 230 thereby outputs the converted multi-bit digital data as the digital signal. In such an example, the decimator 230 reduces a transmission rate of the multi-bit digital data, for example, the digital signal, using a decimator filter.

Figure 3:
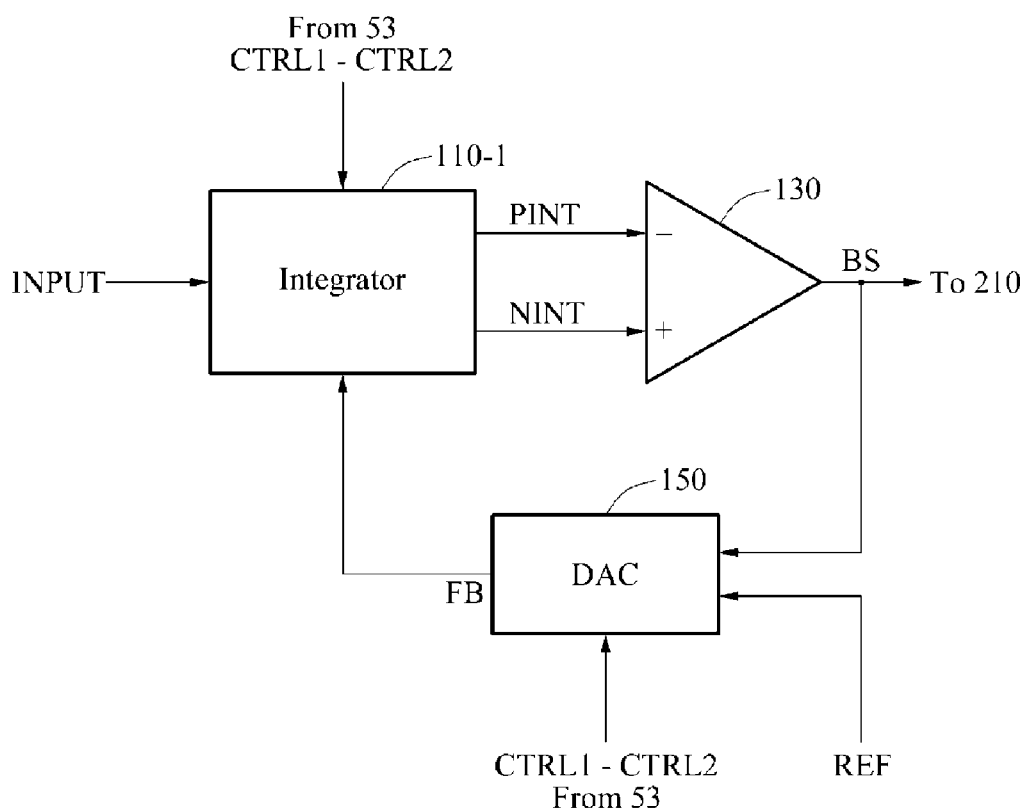
FIG. 3 illustrates an example of a delta-sigma modulator of FIG. 2.

FIG. 3 illustrates an example of the delta-sigma modulator 100 of FIG. 2.

Referring to the example of FIG. 3, a delta-sigma modulator 100-1 includes a first switched-capacitor integrator 110-1, a comparator 130, and a digital-to-analog converter (DAC) 150. The delta-sigma modulator 100-1 of FIG. 3 is an example of the delta-sigma modulator 100 of FIG. 2. However, it is to be noted that FIG. 3 is only one example of the delta-sigma modulator 100 of FIG. 2 and other appropriate examples are also possible.

In the example of FIG. 3, the first switched-capacitor integrator 110-1 samples an input signal, for example, INPUT, in response to control signals, for example, CTRL1 and CTRL2. The first switched-capacitor integrator 110-1 integrates the input signal and a feedback signal in response to the control signals, thereby generating an integrated signal. In such an example, the integrated signal includes a non-inverted integral signal, for example, PINT, and an inverted integral signal, for example, NINT.

Thus, in such an example, the first switched-capacitor integrator 110-1 samples the input signal based on clock phases of the control signals and integrates the input signal and the feedback signal in response to the control signals. By such sampling and integration, the first switched-capacitor integrator 110 generates the non-inverted integral signal and the inverted integral signal.

Subsequently, in the example of FIG. 3, the first switched-capacitor integrator 110-1 outputs the generated non-inverted integral signal and inverted integral signal to the comparator 130. Additional descriptions about a configuration and an operation of the first switched-capacitor integrator 110-1 are provided with reference to FIGS. 4 through 6.

The comparator 130 compares the non-inverted integral signal input to a first input terminal, for example, a negative terminal or −, and the inverted integral signal input to a second input terminal, for example, a positive terminal or +. Based on a result of the comparing, the comparator 130 generates an L-bit digital bitstream, for example, BS. The comparator 130 outputs the L-bit digital bitstream to the digital filter 210 and the DAC 150. In various examples, the comparator 130 is a comparator of a successive approximation register (SAR)-type or a flash ADC type. In such an example, the comparator 130 is implemented as a one-bit ADC or an L-bit ADC.

In the example of FIG. 3, the DAC 150 converts the L-bit digital bitstream into a feedback signal, for example, FB, in response to a first control signal CTRL1, and a second control signal CTRL2. Subsequently, the DAC 150 outputs the converted feedback signal back into the switched-capacitor integrator 110-1. In an example, the feedback signal is an analog signal. In such an example, the DAC 150 is implemented as a one-bit DAC or an L-bit DAC.

Figure 4:
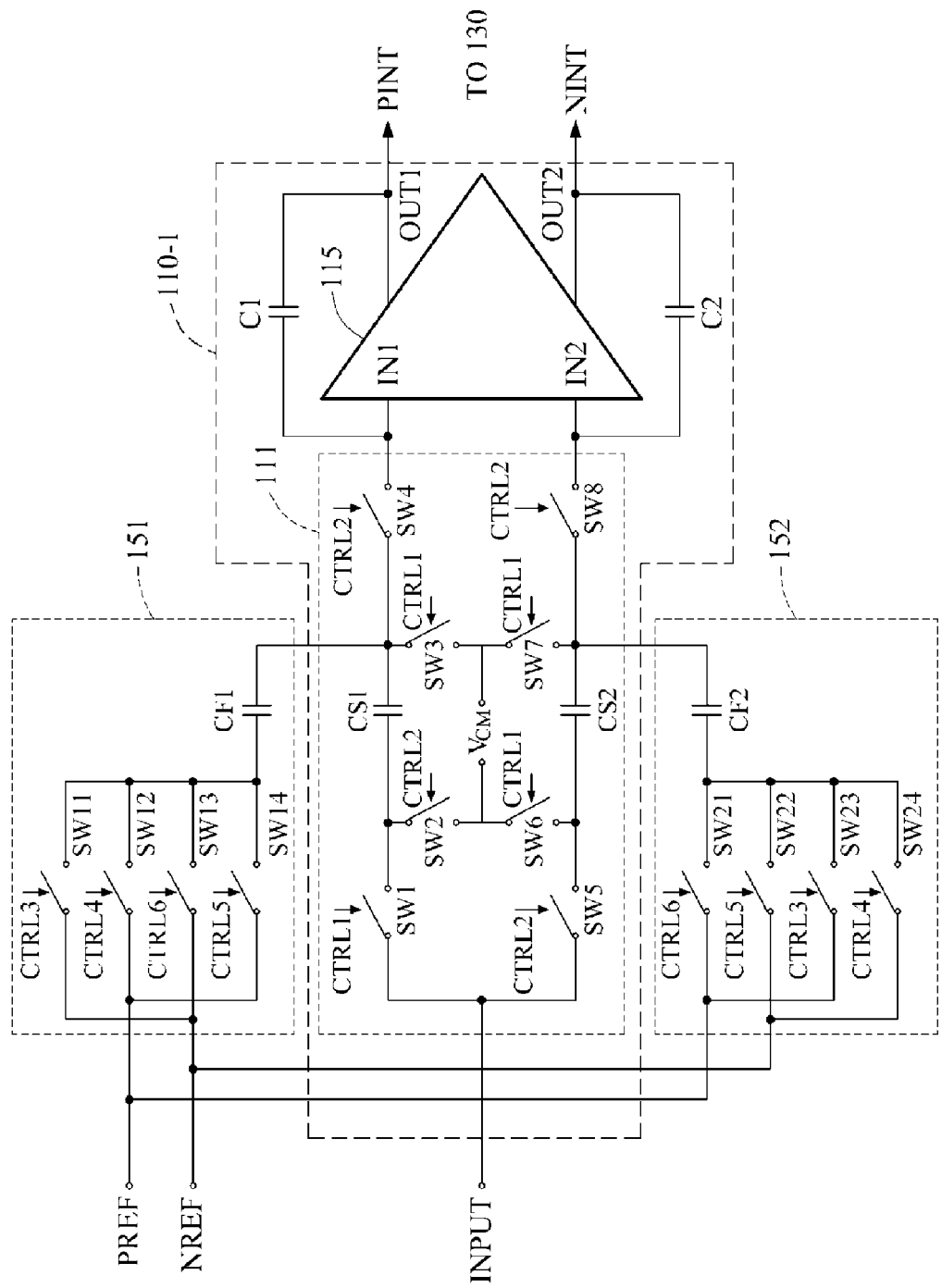
FIG. 4 illustrates an example of a digital-to-analog converter (DAC) and a switched-capacitor integrator of FIG. 3.

FIG. 4 illustrates an example of the DAC 150 and the switched-capacitor integrator 110-1 of FIG. 3.

Referring to the example of FIG. 4, the switched-capacitor integrator 110-1 includes a switched-capacitor circuit 111, an amplifier 115, a first integrating capacitor C1, and a second integrating capacitor C2. Also, the DAC 150 includes various feedback circuits. For example, the DAC includes a first feedback circuit 151 and a second feedback circuit 152.

Furthermore, the amplifier 115 includes a first input terminal IN1, a second input terminal IN2, a first output terminal OUT1, and a second output terminal OUT2. In an example, the first input terminal IN1 is a negative input terminal, for example, −, and the second input terminal IN2 is a positive input terminal, for example, +. Also, in such an example, the first output terminal OUT1 is a positive output terminal, for example, +, and the second output terminal OUT2 is a negative output terminal, for example, −. Additionally, in such an example, the first output terminal OUT1 outputs a non-inverted output signal, for example, PINT, and the second output terminal OUT2 outputs an inverted output signal, for example, NINT.

In the example of FIG. 4, the first integrating capacitor C1 is disposed between the first input terminal IN1 and the first output terminal OUT1. Also in the example of FIG. 4, the second integrating capacitor C2 is disposed between the second input terminal IN2 and the second output terminal OUT2.

In the example of FIG. 4, the feedback circuits generate a feedback signal, for example, FB, based on a reference signal, for example, REF. In such an example, the feedback circuits include feedback capacitors, for example, a first feedback capacitor CF1 and a second feedback capacitor CF2. In this example, the feedback circuits sample the reference signal through the feedback capacitors and generate the feedback signal based on the use of such circuitry.

In the example of FIG. 4, the reference signal includes a non-inverted reference signal, for example, PREF, and an inverted reference signal, for example, NREF. The reference signal is a signal used as a reference for operating the switched-capacitor integrator 110-1. Thus, the reference signal is used to help determine a full range of an input voltage. For example, the reference signal is at least one signal included in the full range of the input voltage. The feedback circuits, as described further above, generate the feedback signal by sampling at least one of the non-inverted reference signal and the inverted signal in response to control signals CTRL1 through CTRL6.

Furthermore, in the example of FIG. 4, the feedback circuits transfer the feedback signal into the switched-capacitor integrator 110-1. In such an example, the feedback circuits include the first feedback circuit 151 and the second feedback circuit 152. In this example, the feedback circuits generate the feedback signal in response to the control signals CTRL3 through CTRL6, and then transfer the feedback signal to the switched-capacitor integrator 110-1. Related descriptions including additional information about generating the control signals CTRL3 through CTRL6 are provided with reference to FIG. 5.

In the example of FIG. 4, the first feedback circuit 151 includes the first feedback capacitor CF1 and an array of switches SW 11 through SW14. The first feedback circuit 151 generates a first feedback signal FB1 by using the first feedback capacitor CF1, and transfers the first feedback signal FB1 to the first integrating capacitor C1.

Also in the example of FIG. 4, the second feedback circuit 152 includes the second feedback capacitor CF2 and an array of switches SW 21 through SW24. The second feedback circuit 152 generates a second feedback signal FB2 by using the second feedback capacitor CF2, and transfers the second feedback signal FB2 to the second integrating capacitor C2.

In the example of FIG. 4, the switched-capacitor circuit 111 is connected with the first input terminal IN1 and the second input terminal IN2. In such an example, the switched capacitor circuit 111 samples an input signal, for example, INPUT, in response to the control signals CTRL1 and CTRL2. The switched capacitor circuit 11 also integrates the input signal and the feedback signal through the first integrating capacitor C1 and the second integrating capacitor C2, in response to the control signals CTRL1 and CTRL2.

Thus, in such an example, the switched-capacitor circuit 111 includes a first sampling capacitor CS1, a second sampling capacitor CS2, and an array of switches SW1 through SW8.

In this example, the first sampling capacitor CS1 transfers a sampling signal of the input signal to the first integrating capacitor C1. Thus, the sampling signal of the input signal is integrated by the first integrating capacitor C1.

Also, in this example, the second sampling capacitor CS2 transfers the sampling signal of the input signal to the second integrating capacitor C2. Thus, the sampling signal of the input signal is integrated by the second integrating capacitor C2.

In the example of FIG. 4, the switches in the array of switches SW1 through SW8 are controlled based on clock phases of the control signals CTRL1 and CTRL2. Thus, the switches in the array of switches SW1 through SW8 are controlled based on the clock phases such that the input signal is transmitted to at least one of the first sampling capacitor CS1 and the second sampling capacitor CS2. The switches are also controlled so that the input signal of the first sampling capacitor CS1 is integrated by the first integrating capacitor C1 while the input signal of the second sampling capacitor CS2 is simultaneously integrated by the second integrating capacitor C2.

As an example, in a first clock phase of the control signals CTRL1 and CTRL2, the input signal is sampled by the first sampling capacitor CS1. For example, in the first clock phase of the control signals CTRL1 and CTRL2, the input signal is sampled by the first sampling capacitor CS1 when the switches SW1, SW3, SW6, and SW7 are turned on and the switches SW2, SW4, SW5, and SW8 are turned off.

Also, in such an example, in the first clock phase of the control signals CTRL1 and CTRL2, the first feedback signal FB1 is generated by the first feedback capacitor CF1 and the second feedback signal FB2 is generated by the second feedback capacitor CF2 when the switches SW11 and SW23 are turned on and the switches SW12, SW13, SW14, SW21, SW22, and SW24 are turned off.

Further, in such an example, in a second clock phase of the control signals CTRL1 and CTRL2, an output signal of the first sampling capacitor CS1 and an output signal of the first feedback capacitor CF1 are integrated by the first integrating capacitor C1. Additionally, an output signal of the second sampling capacitor CS2 and an output signal of the second feedback capacitor CF2 are integrated by the second integrating capacitor C2. For example, in the second clock phase of the control signals CTRL1 and CTRL2, the output signal of the first sampling capacitor CS1 is integrated by the first integrating capacitor C1 and the output signal of the second sampling capacitor CS2 is integrated by the second integrating capacitor C2 when the switches SW2, SW4, SW5, and SW8 are turned on and the switches SW1, SW3, SW6, and SW7 are turned off.

Also, in the second clock phase of the control signals CTRL1 and CTRL2, the output signal of the first feedback capacitor CF1 is integrated by the first integrating capacitor C1 and the output signal of the second feedback capacitor CF2 is integrated by the second integrating capacitor C2 when the switches SW14 and SW22 are turned on and the switches SW11, SW12, SW13, SW21, SW23, and SW24 are turned off.

In an example, the first sampling capacitor CS1 and the second sampling capacitor CS2 are each, for example, a capacitor for sampling the input signal. Also, the first feedback capacitor CF1 and the second feedback capacitor CF2 are each, for example, a capacitor for sampling the reference signal, for example, PREF and NREF.

In the example of FIG. 4, the amplifier 115 integrates the input signal and the feedback signal using the first integrating capacitor C1 and the second integrating capacitor C2. Based on upon the results of this process, the amplifier 115 generates an integral signal, for example, PINT and NINT. In an example, the amplifier 115 is implemented as an operational amplifier or an operational transconductance amplifier (OTA). However, other appropriate types of amplifier 115 are used in other examples.

Hence, the switched-capacitor integrator 110-1 outputs the non-inverted output signal and the inverted output signal. Thus, the switched-capacitor integrator 110-1 has a differential output. Since noise occurs proportionally to the differential output, the switched-capacitor integrator 110-1 is not affected by a mismatch phenomenon between a common value and a capacitor. The amplifier 115 outputs the integral signal to the comparator 130 through an output terminal. For example, the amplifier 115 uses the first input terminal IN1 and the first output terminal OUT1 to perform these operations.

Figure 5:
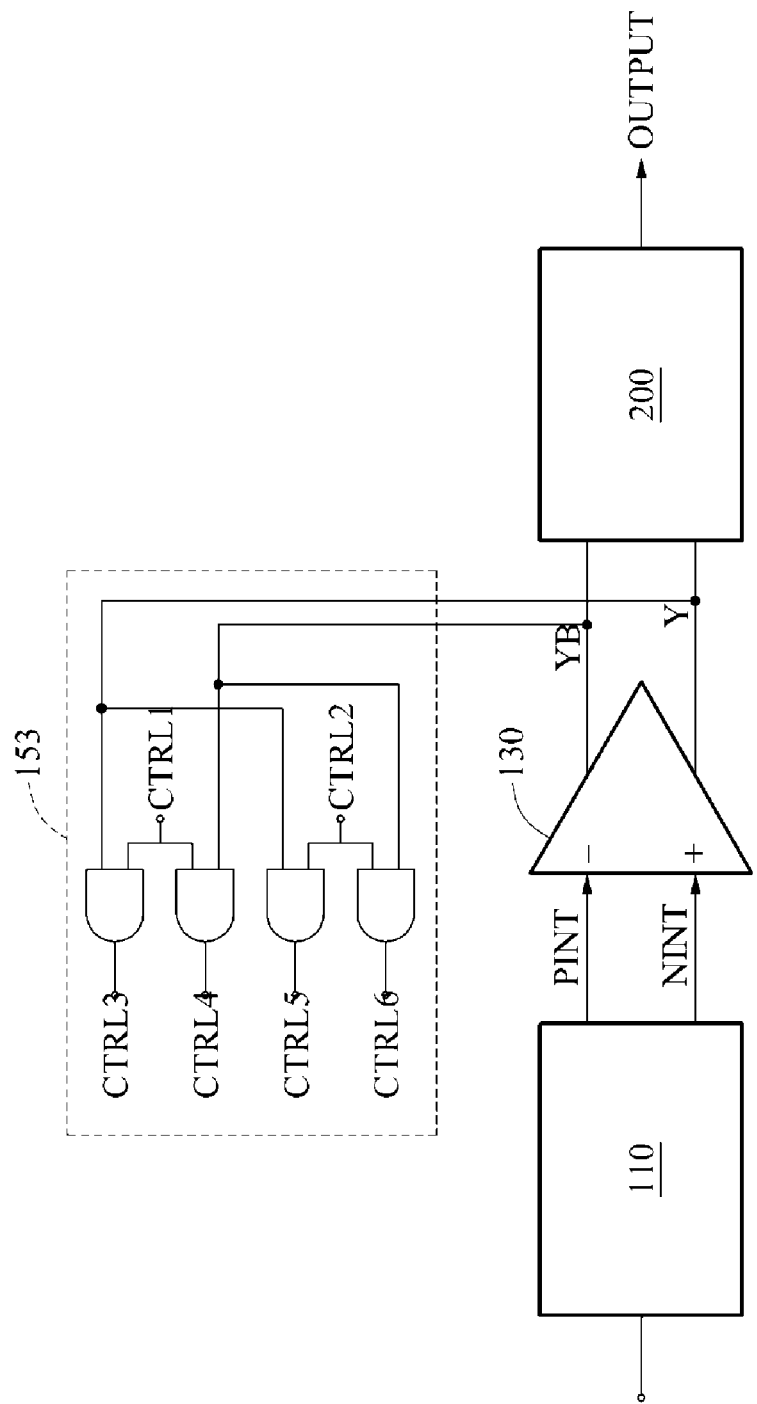
FIG. 5 illustrates an example of a control signal for the switched-capacitor integrator of FIG. 4.

FIG. 5 illustrates an example of a control signal for the switched-capacitor integrator 110-1 of FIG. 4.

FIG. 5 illustrates a switched-capacitor integrator 110, the comparator 130, a switch control circuit 153, and the decimation filter 200.

In the example of FIG. 5, the control signals in the switch control circuit 153 include control signals CTRL1 and CTRL2 to control the switched-capacitor circuit 111, and control signals CTRL3 through CTRL6 to control feedback circuits, for example, the first feedback circuit 151 and the second feedback circuit 152.

In such an example, the switch control circuit 153 generates the control signals CTRL3 through CTRL6, and controls an array of switches of the feedback circuits based on the control signals CTRL3 through CTRL6. In this example, the switch control circuit 153 is included in the DAC 150. For example, the DAC 150 includes the switch control circuit 153 and the feedback circuits.

The switch control circuit 153 generates the control signals CTRL3 through CTRL6 based on the control signals CTRL1 and CTRL2, a non-inverted output Y of the comparator 130, and an inverted output YB of the comparator 130. An output, for example, the non-inverted output Y and the inverted output YB, of the comparator 130 is generated based on an output, for example, PINT and NINT, of the switched-capacitor integrator 110. Concisely, the control signals CTRL3 through CTRL6 are generated based on the control signals CTRL1 and CTRL2, and the control signals CTRL1 and CTRL2 are generated based on the output of the switched-capacitor integrator 110.

Figure 6:
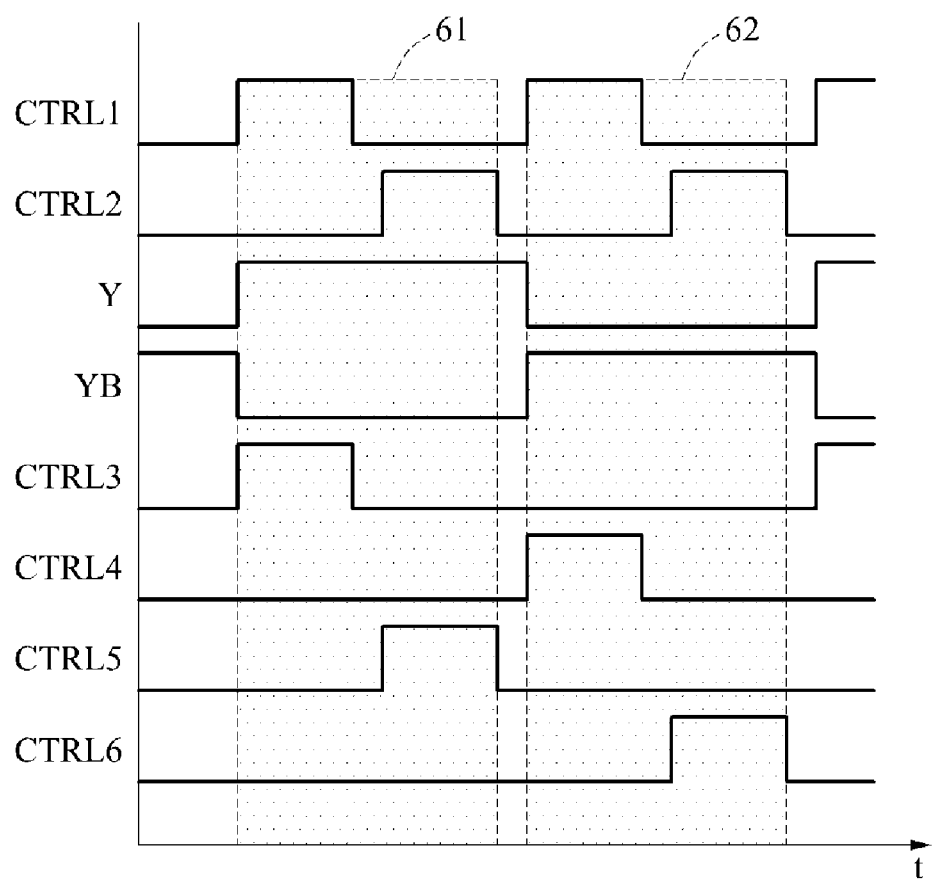
FIG. 6 illustrates an example of an operation performed by the switched-capacitor integrator of FIG. 4.

FIG. 6 illustrates an example of an operation performed by the switched-capacitor integrator 110-1 of FIG. 4.

FIG. 6 is a timing diagram illustrating control signals CTRL1 through CTRL6 and an output, for example, YB and Y, of the comparator 130.

In a case of an ADC used for a high resolution signal such as a biosignal having a relatively small bandwidth, such an ADC potentially requires removal of direct current properties and low frequency noise. Also, in response to a change in a common voltage of an input signal of the ADC, an error potentially occurs due to a difference between a common voltage of a reference voltage and a common voltage of a system, and the low frequency noise potentially occurs due to a mismatch phenomenon of a capacitor. Thus, in a process of converting a single-ended input signal, the single-ended input signal is provided in a differential form to have robustness against a power source voltage and noise, improving the accuracy of examples.

Thus, the switched-capacitor integrator 110-1 converts the single-ended input signal, for example, INPUT, into the differential form, thereby removing noise due to the difference between a common voltage of the DAC 150 and the common voltage of the system. Also, from the switched-capacitor integrator 110-1, the reference voltage, for example, PREF and NREF, is applied in a turn-on cycle of the control signal CTRL1 due to the operation of switches SW12, SW13, SW23, and SW24, as discussed further above. Such an operation of the switches SW12, SW13, SW23, and SW24 leads to a reduction in the noise and thus, a capacitance in a feedback capacitor, for example, the first feedback capacitor CF1 and the second feedback capacitor CF2 is reduced. In response to such a reduction in the capacitance, an integrator is provided in a reduced size, offering advantages in examples that use such an approach.

Equations 1 and 2 express an output of the switched-capacitor integrator 110-1 in an interval 61 of FIG. 6, as shown below.

$$V_{OUT1}(n) = V_{OUT1}(n-1) + \frac{C_{S1}}{C_1} \cdot (V_{INPUT}(n-1) - V_{CM}) - \frac{C_{F1}}{C_1} \cdot (V_{PREF} - V_{NREF}) \quad \text{Equation 1}$$

$$V_{OUT2}(n) = V_{OUT2}(n-1) - \frac{C_{S2}}{C_2} \cdot \left(V_{INPUT}\left(n-\frac{1}{2}\right) - V_{CM}\right) - \frac{C_{F2}}{C_2} \cdot (V_{NREF} - V_{PREF}) \quad \text{Equation 2}$$

In Equations 1 and 2, n denotes an output order, and $V_{CM}$ denotes a common voltage. To analyze a low frequency band noise on a path of the DAC 150, an input signal $V_{INPUT}$ is set as the common voltage, $V_{CM}$. In this example, the output of the switched-capacitor integrator 110-1 in the interval 61 is expressed as shown in Equations 3 and 4.

$$V_{OUT1}(n) = V_{OUT1}(n-1) - \frac{C_{F1}}{C_1} \cdot (V_{PREF} - V_{NREF}) \quad \text{Equation 3}$$

$$V_{OUT2}(n) = V_{OUT2}(n-1) - \frac{C_{F2}}{C_2} \cdot (V_{NREF} - V_{PREF}) \quad \text{Equation 4}$$

Also, a differential output of the switched-capacitor integrator 110-1 in the interval 61 is expressed as shown in Equation 5.

$$V_{OUT1}(n) - V_{OUT2}(n) = V_{OUT1}(n-1) - V_{OUT2}(n-1) - \left\{\frac{C_{F1}}{C_1} \cdot (V_{PREF} - V_{NREF}) - \frac{C_{F2}}{C_2} \cdot (V_{NREF} - V_{PREF})\right\} \quad \text{Equation 5}$$

Equations 6 and 7 express an output of the switched-capacitor integrator 110-1 in an interval 62 of FIG. 6 as shown below.

$$V_{OUT1}(n) = V_{OUT1}(n-1) - \frac{C_{F1}}{C_1} \cdot (V_{NREF} - V_{PREF}) \quad \text{Equation 6}$$

$$V_{OUT2}(n) = V_{OUT2}(n-1) - \frac{C_{F2}}{C_2} \cdot (V_{PREF} - V_{NREF}) \quad \text{Equation 7}$$

Also, a differential output of the switched-capacitor integrator 110-1 in the interval 62 is expressed as shown in Equation 8.

$$V_{OUT1}(n) - V_{OUT2}(n) = V_{OUT1}(n-1) - V_{OUT2}(n-1) - \left\{\frac{C_{F1}}{C_1} \cdot (V_{NREF} - V_{PREF}) - \frac{C_{F2}}{C_1} \cdot (V_{PREF} - V_{NREF})\right\} \quad \text{Equation 8}$$

As shown in Equations 6 and 7, an influence of $V_{CM}$ is absent in some examples. Also, an X % mismatch potentially occurs between $C_{F1}/C_1$ and $C_{F2}/C_2$. Equations 9 and 10 express values $V_{DAC\_1}$ and $V_{DAC\_2}$ delivered to the output of the switched-capacitor integrator 110-1 in the interval 61 and the interval 62, as shown below.

$$V_{DAC\_1} = \left\{\frac{C_F}{C_I} \cdot (V_{PREF} - V_{NREF}) - \frac{C_F}{C_I} \cdot (V_{NREF} - V_{PREF}) \cdot \left(1 - \frac{X}{100}\right)\right\} \quad \text{Equation 9}$$

$$IV_{DAC\_2} = \left\{\frac{C_F}{C_I} \cdot (V_{NREF} - V_{PREF}) - \frac{C_F}{C_I} \cdot (V_{PREF} - V_{NREF}) \cdot \left(1 - \frac{X}{100}\right)\right\} \quad \text{Equation 10}$$

$C_{F1}/C_1$ is also alternatively expressed as $C_F/C_S$, and $C_{F2}/C_2$ is also alternatively expressed as $C_F/C_S(1-X/100)$ such that the mismatch occurring between $C_{F1}/C_1$ and $C_{F2}/C_2$ is easily recognized by using Equations 9 and 10. $V_{DAC\_OUT\_N}$ denotes a sum of values delivered to the output of the switched-capacitor integrator 110-1 by the DAC 150 when N output signals are acquired. Also, $V_{DAC\_OUT\_N}$ is alternatively expressed as shown in Equation 11.

$$V_{DAC\_OUT\_N} = V_{DAC\_1}\left(\frac{N}{2}\right) + V_{DAC\_2}\left(\frac{N}{2}\right) \quad \text{Equation 11}$$

Also, an average of the values delivered by the DAC 150 to the output of the switched-capacitor integrator 110-1 is expressed as shown in Equation 12.

$$V_{DAC\_OUT} = \frac{V_{DAC\_1} + V_{DAC\_2}}{2} \quad \text{Equation 12}$$

Furthermore, Equation 13 expresses a value obtained by substituting Equations 9 and 10 into Equation 12.

$$V_{DAC\_OUT} = \frac{C_F}{C_I} \cdot \frac{X}{100} \cdot \left\{\frac{(V_{NREF} - V_{PREF})}{2} + \frac{(V_{PREF} - V_{NREF})}{2}\right\} \quad \text{Equation 13}$$

In Equation 13, $V_{DAC\_OUT}$ denotes the average of the values delivered by the DAC 150 to the output of the switched-capacitor integrator 110-1, and potentially takes on a value of "0". For example, when the common voltage of the DAC 150 differs from $V_{CM}$ corresponding to the common voltage for the input signal of the delta-sigma ADC 30, the average of the values delivered by the DAC 150 to the output of the switched-capacitor integrator 110-1 is "0".

The switched-capacitor integrator 110-1 samples the reference signal in a clock phase of a first control signal CTRL1 and thus, a voltage difference of the reference signal is delivered.

In such an example, since the noise occurs in the switched-capacitor integrator 110-1 proportionally to a differential output, the switched-capacitor integrator 110-1 is not affected by the mismatch phenomenon occurring between the common value and the capacitor. Also, the switched-capacitor integrator 110-1 differentially outputs a non-inverted integral signal, for example, PINT, and an inverted integral signal, for example, NINT, thereby being more robust against noise than other approaches.

Figure 7:
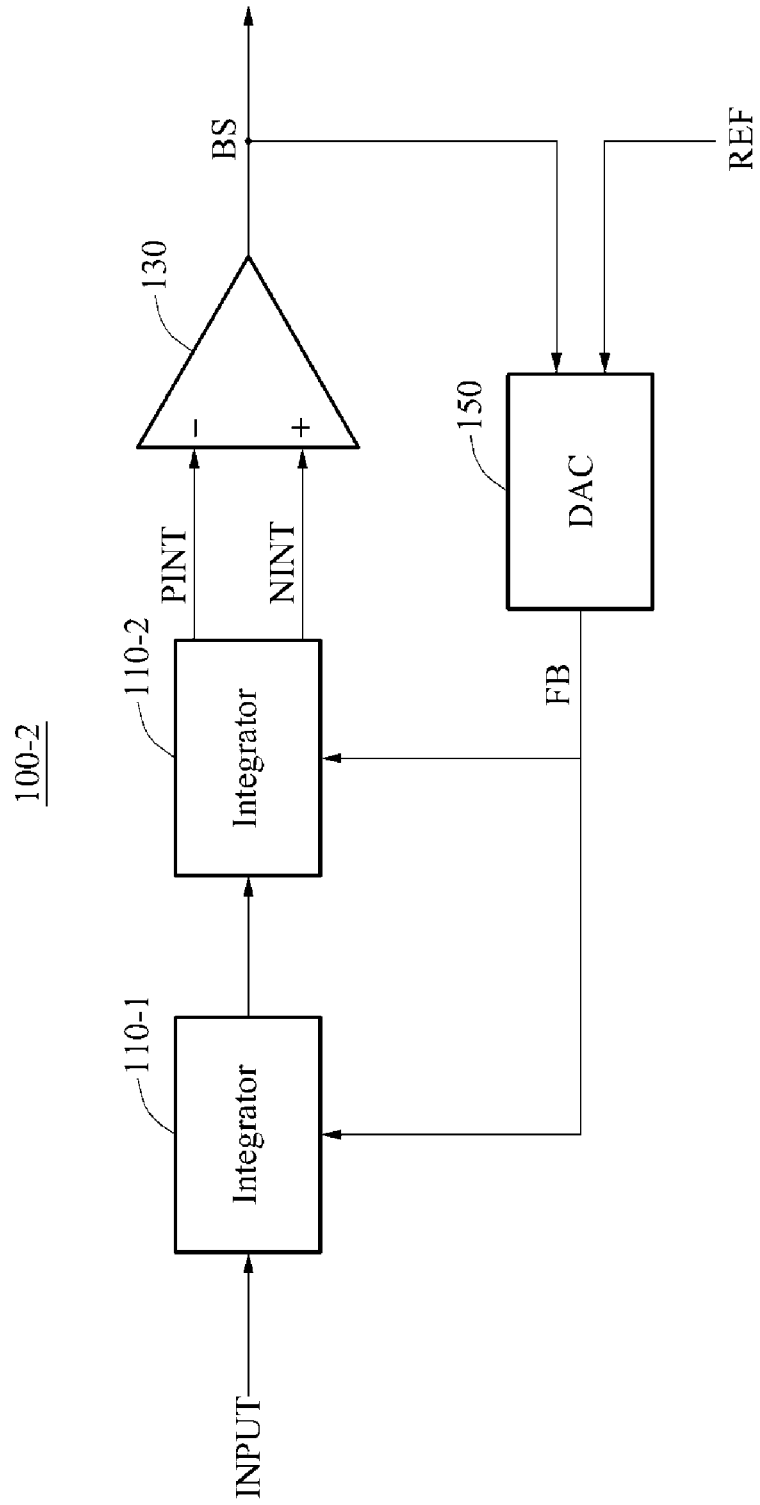
FIG. 7 illustrates another example of the delta-sigma modulator of FIG. 2.

FIG. 7 illustrates another example of the delta-sigma modulator 100 of FIG. 2.

Referring to the example of FIG. 7, a delta-sigma modulator 100-2 includes a first switched-capacitor integrator, for example, the switched-capacitor integrator 110-1, a second switched-capacitor integrator 110-2, the comparator 130, and the DAC 150. In FIG. 7, the delta-sigma modulator 100-2 is illustrated as another example of the delta-sigma modulator 100 of FIG. 2. In such an example, a configuration and an operation of the second switched-capacitor integrator 110-2 is equivalent to the configuration and the operation of the switched-capacitor integrator 110-1 of FIG. 4 in practice. Other than the operation performed by the second switched-capacitor integrator 110-2, an operation of the delta-sigma modulator 100-2 is equivalent to the operation of the delta-sigma modulator 100-1 of FIG. 3 in practice.

Figure 8:
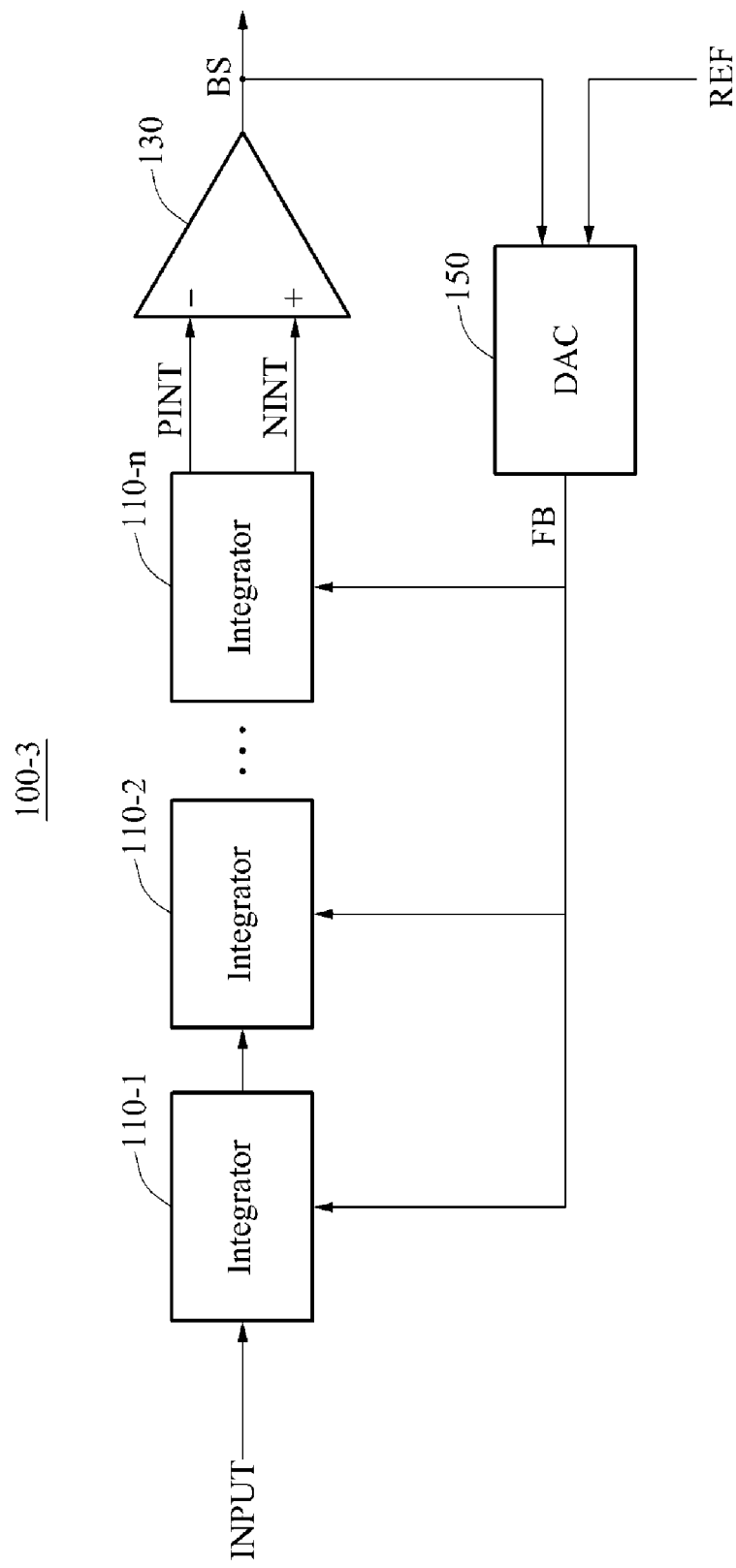
FIG. 8 illustrates still another example of the delta-sigma modulator of FIG. 2.

FIG. 8 illustrates still another example of the delta-sigma modulator 100 of FIG. 2.

Referring to the example of FIG. 8, a delta-sigma modulator 100-2 includes a plurality of switched-capacitor integrators including the switched-capacitor integrator 110-1 through a switched-capacitor integrator 110-n, n being a natural number greater than "2". A configuration and an operation for each of the plurality of switched-capacitor integrators is equivalent or similar to the configuration and the operation of the first switched-capacitor integrator, for example, the switched-capacitor integrator 110-1 of FIG. 4 in practice. An operation of the delta-sigma modulator 100-3 is equivalent or similar to the operation of the delta-sigma modulator 100-1 of FIG. 3 in practice.

Figure 9:
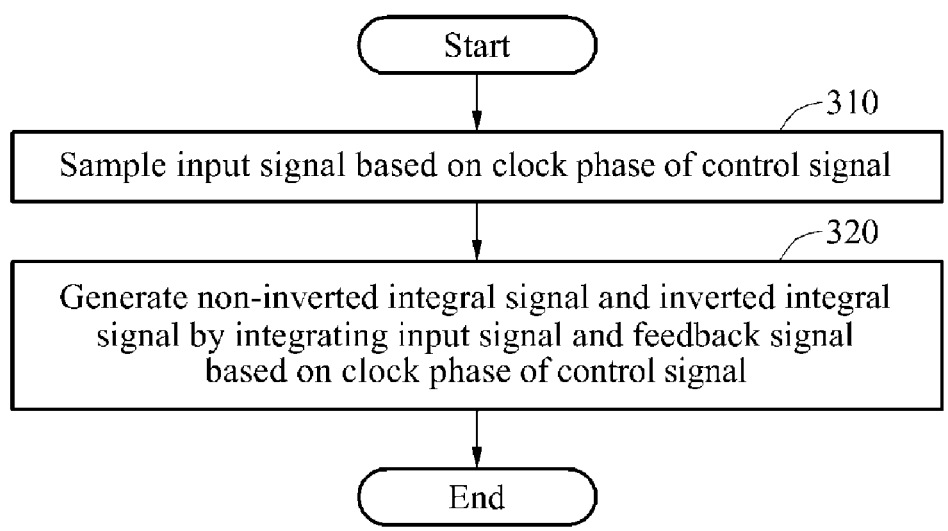
FIG. 9 illustrates an example of a method of operating the switched-capacitor integrator of FIG. 3.

FIG. 9 illustrates an example of a method of operating the switched-capacitor integrator 110-1 of FIG. 3.

Referring to FIGS. 1 through 6, and 9, in operation 310, the method samples an input signal based on a clock phase of the control signal. For example, the switched-capacitor integrator 110-1 samples an input signal, for example, a single-ended input signal INPUT, based on clock phases of control signals CTRL1 through CTRL6.

In operation 320, the method generates a non-inverted integral signal and an inverted integral signal by integrating the input signal and a feedback signal based on the clock phase of the control signal. For example, the switched-capacitor integrator 110-1 generates a non-inverted integral signal, for example, PINT, and an inverted integral signal, for example, NINT, by integrating the input signal and a feedback signal, for example, PB, based on the clock phases of the control signals CTRL1 through CTRL6 and a clock phase of a control signal CTRL7.

Figure 10:
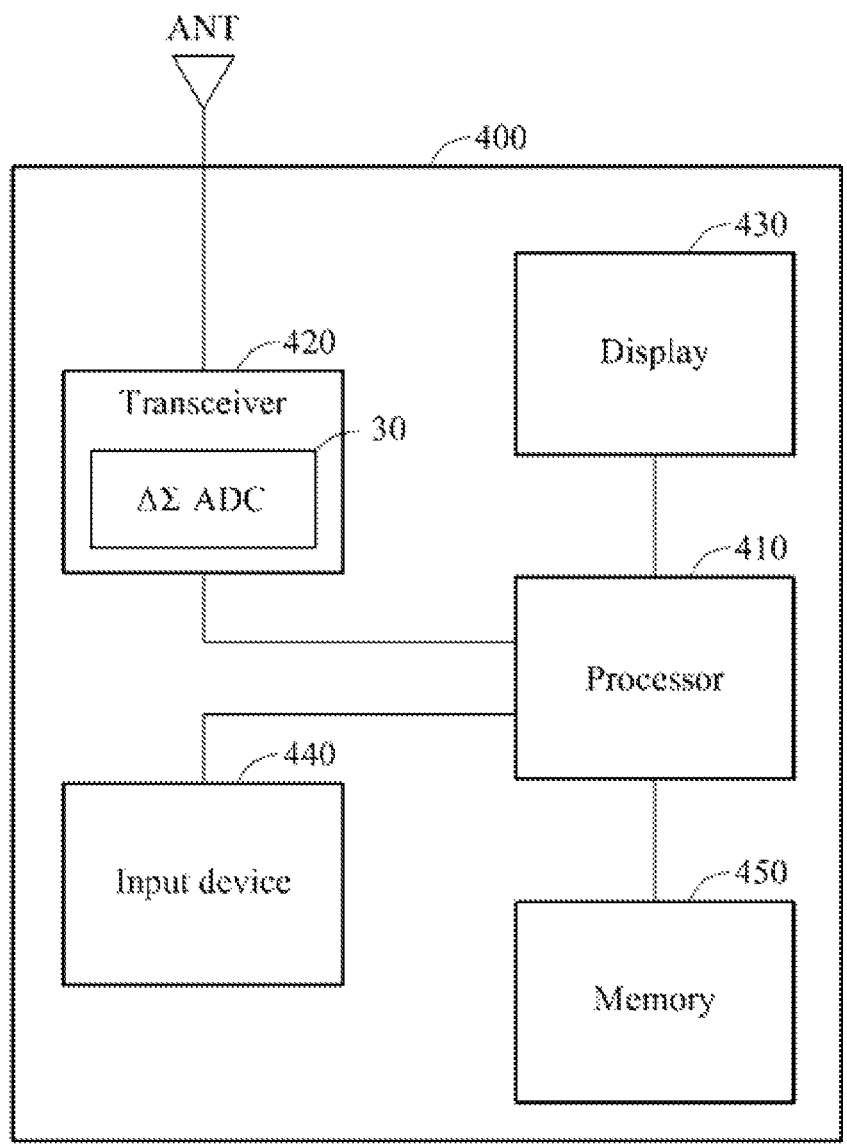
FIG. 10 illustrates another example of an electronic system including the delta-sigma ADC of FIG. 1.

FIG. 10 illustrates an example of an electronic system 400 including the delta-sigma ADC 30 of FIG. 1. In the example of FIG. 10, the electronic system 400 is illustrated as another example of the electronic system 10 of FIG. 1.

Referring to the example FIG. 10, the electronic system 400 includes a processor 410, a transceiver 420, a display 430, an input device 440, and a memory 450. The electronic system 400 may be, for example, a portable electronic device such as a mobile phone, a smartphone, a tablet PC, and the like. However, in other examples, other appropriate components are included instead of or in addition to these components.

For example, the processor 410 controls an overall operation of the electronic system 400. In an example, the processor 410 controls an operation for each element, for example, the transceiver 420, the display 430, the input device 440, and the memory 450. However, in other examples, other appropriate components are included instead of or in addition to these components.

In such an example, the transceiver 420 may transmit and receive a signal or data using an antenna, for example, ANT. In this example, the transceiver 420 convert the signal received through the antenna into a signal, for example, a digital signal, to be processed by the processor 410. The transceiver 420 converts the received signal into the signal to be processed by the processor 410 using the delta-sigma ADC 30, as discussed above.

Further, the processor 410 processes the signal output from the transceiver 420, and stores the processed signal in the memory 450 or display on the display 430.

The transceiver 420 converts the signal output from the processor 410, into a radio signal, and externally outputs the radio signal through the antenna. In this example, the delta-sigma ADC 30 operates as a delta-sigma DAC to convert the digital signal provided by the processor 410 into an analog signal for output purposes.

The input device 440 is, for example, a device for inputting a control signal to control the operation of the processor 410 or the signal or data to be processed by the processor 410. The input device is implemented as, in various examples, a keyboard, a keypad, a pointing device such as a computer mouse, and/or a touch pad.

The processor 410 controls the display 430 to display the data output from the input device 440, the signal output from the transceiver 420, and the data output from the memory 450.

Figure 11:
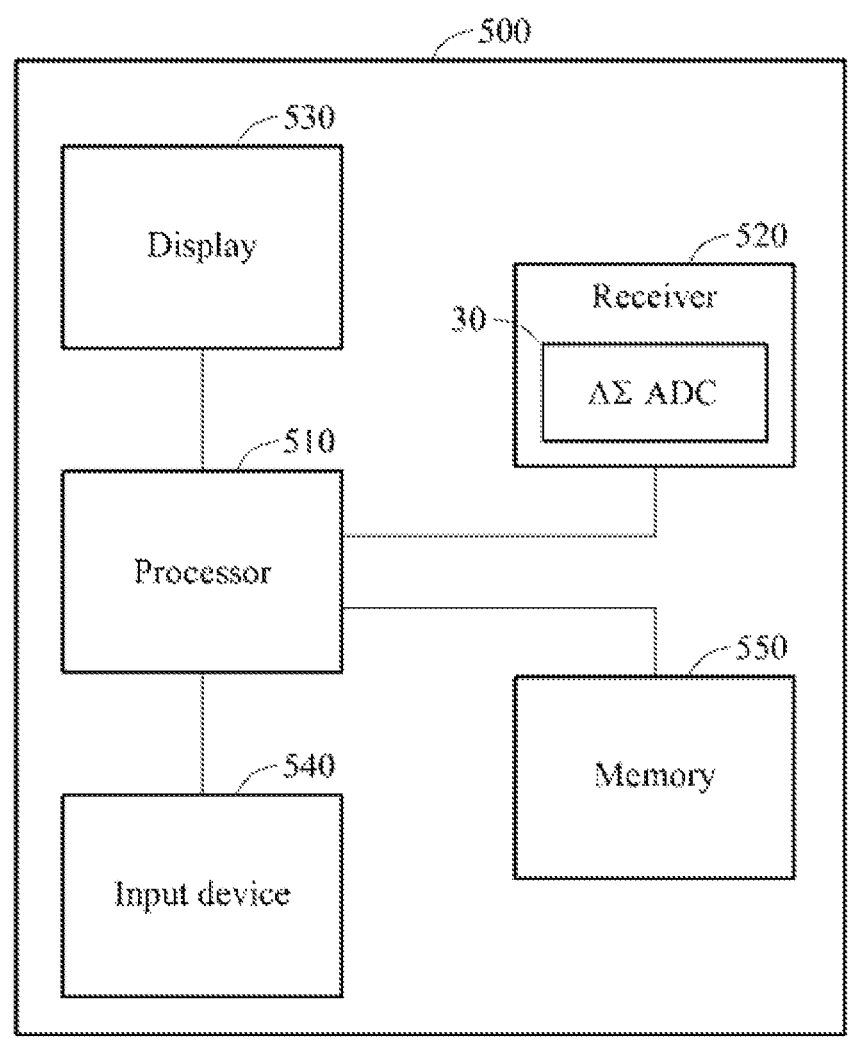
FIG. 11 illustrates still another example of an electronic system including the delta-sigma ADC of FIG. 1.

FIG. 11 illustrates an example of an electronic system 500 including the delta-sigma ADC 30 of FIG. 1. In the example of FIG. 11, the electronic system 500 is illustrated as still another example of the electronic system 10 of FIG. 1.

Referring to the example of FIG. 11, the electronic system 500 includes a processor 510, a receiver 520, a display 530, an input device 540, and a memory 550. However, in other examples, other appropriate components are included instead of or in addition to these components.

In various examples, the electronic system 500 is implemented as a data processing apparatus, for example, a PC, a tablet PC, a netbook, an e-reader, a PDA, a portable multimedia player (PMP), a moving picture experts group (MPEG)-1 or MPEG-2 audio layer III (MP3) player, and an MPEG-4 (MP4) player. However, these are only examples of data processing apparatuses, and alternative data processing apparatuses are used in other examples.

In the example of FIG. 11, the receiver 520 receives a signal output from a transmitter, not shown, and converts the received signal into a signal, for example, a digital signal, to be processed by the processor 510. The receiver 520 converts the received signal into the signal to be processed by the processor 510 using the delta-sigma ADC 30 to transform the analog signal into digital information for use by the processor 510.

The processor 510 processes the signal output from the receiver 520, and stores the processed signal in the memory 550 or displays the processed signal on the display 530.

The input device 540 is, for example, a device for inputting a control signal to control the operation of the processor 510 or the signal or data to be processed by the processor 510. Examples of possible input devices have been presented, above.

The processor 510 controls the display 530 to display the data output from the input device 540, the signal output from the receiver 520, and the data output from the memory 550.

Figure 12:
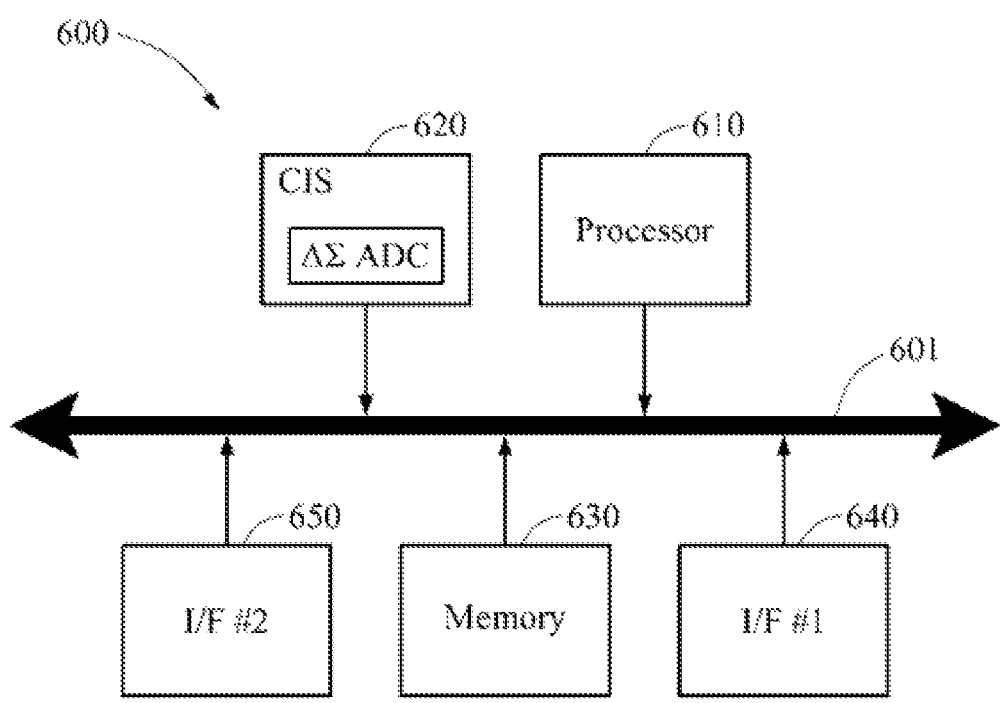
FIG. 12 illustrates yet another example of an electronic system including the delta-sigma ADC of FIG. 1.

FIG. 12 illustrates an example of an electronic system 600 including the delta-sigma ADC 30 of FIG. 1. In FIG. 12, the electronic system 600 is illustrated as yet another example of the electronic system 10 of FIG. 1.

Referring to FIG. 12, the electronic system 600 includes a processor 610, an image sensor 620, a memory device 630, a first interface 640, and a second interface 650. However, in other examples, other appropriate components are included instead of or in addition to these components.

The electronic system 600 is, for example, an image processing device for generating an image by processing an image signal output from the image sensor 620 sensing an object, and processing the generated image. As an example, the electronic system 600 is an image processing device such as a medical instrument, an electronic device providing a diagnosis function, a digital camera, a portable communication device, for example, a mobile phone, a PDA, and a PMP including a digital camera, a satellite communication device, and the like. However, these are only examples, and other appropriate image processing devices are used in other examples.

In the example of FIG. 12, the processor 610 communicates with each element, for example, the image sensor 620, the memory device 630, the first interface 640, and the second interface 650, using a bus 601. The processor 610 processes an image signal or image data output from the image sensor 620.

In this example, the image sensor 620 generates image signals or image data corresponding to digital signals obtained from analog signals generated based on a plurality of pixels. For example, the image sensor 620 generates the image signals based on the analog signals, using the delta-sigma ADC 30.

Also, the memory device 630 stores a signal or data processed by the processor 610. In an example, the memory device 630 is implemented as a non-volatile memory, for example, an electrically erasable programmable read-only memory (EEPROM), a flash memory, a phase-change random-access memory (PRAM), a magnetoresistive RAM (MRAM), and/or a resistive RAM (ReRAM). In another example, the memory device 630 is implemented as a volatile memory, for example, a dynamic RAM (DRAM) and/or a static RAM (SRAM). However, these are only examples, and other appropriate memory technologies are used in other examples.

In the example of FIG. 12, the first interface 640 outputs the signal or data processed by the processor 610 to an external source, and transmits a signal or data input from the external source to the processor 610. Accordingly, the processor 610 controls the first interface 640 in order to transmit data stored in the memory device 630 to the external source. Also, the processor 610 controls the first interface 640 to store input data in the memory device 630.

Also in the example of FIG. 12, the second interface 650 wirelessly outputs the signal or data processed by the processor 610 to the external source. Also, the second interface 650 wirelessly transmits a signal or data input from the external source, to the processor 610.

Figure 13:
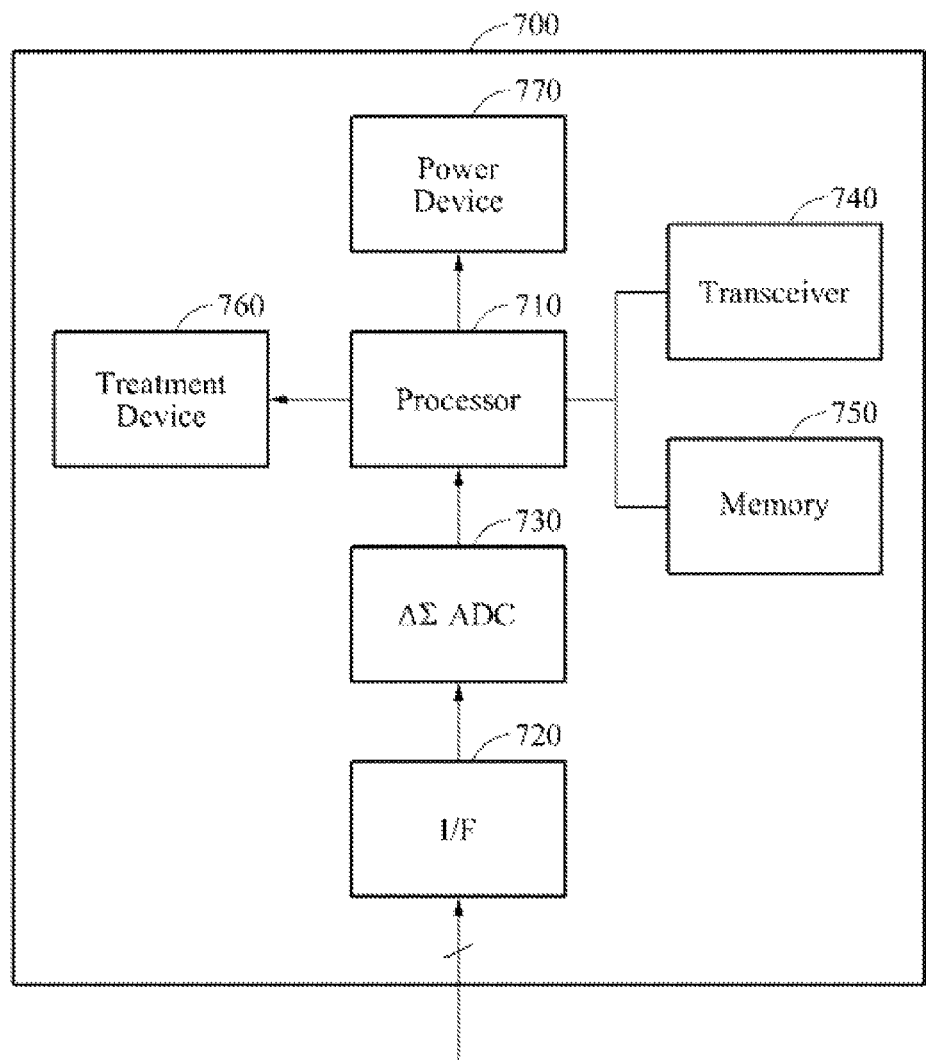
FIG. 13 illustrates further another example of an electronic system including the delta-sigma ADC of FIG. 1.

FIG. 13 illustrates an example of an electronic system 700 including the delta-sigma ADC 30 of FIG. 1. In the example of FIG. 13, the electronic system 700 is illustrated as another example of the electronic system 10 of FIG. 1.

Referring to FIG. 13, the electronic system 700 includes a processor 710, an interface 720, a delta-sigma ADC 730, a transceiver 740, a memory 750, and a power device 770. Depending on an example, the electronic system 700 may also include a treatment device 760. However, in other examples, other appropriate components are included instead of or in addition to these components.

In the example of FIG. 13, the electronic system 700 is, for example, a patient monitor, an electrocardiogram (ECG) device, an implantable medical device (IMD), and a medical imaging device. An example that is an IMD includes, for example, a pacemaker and an implantable cardioverter-defibrillator (ICD).

In the example of FIG. 13, the electronic system 700 monitors a patient. Also, the electronic system 700 directly or indirectly provides a treatment remedy to the patient based on a result of the monitoring.

For example, the interface 720 is a sensor interface that receives a sensing signal output from an external sensor, not shown. As an example, the interface 720 receives a sensing signal output from, for example, a pressure sensor, an accelerometer, an activity sensor, an impedimetric sensor, a temperature sensor, and a pH meter. However, these are only examples, and other sensors are used in other examples to provide sensed information to the electronic system 700. In an example, the sensing signal is an analog signal.

In the example of FIG. 13, the delta-sigma ADC 730 converts the sensing signal transmitted from the interface 720 into a digital signal, and output the digital signal to the processor 710. The delta-sigma ADC 730 is, for example, the delta-sigma ADC 30 of FIG. 1. In an example, the delta-sigma ADC 730 includes a plurality of delta-sigma ADCs including the delta-sigma ADC 30 of FIG. 1.

Also in the example of FIG. 13, the processor 710 processes the digital signal transmitted from the delta-sigma ADC 730. The processor 710 stores the processed signal or data in the memory 750, or transmits the processed signal or data to a host, not shown, using the transceiver 740. For example, the host controls the electronic system 700. Also, in an example, the processor 710 controls an operation of the treatment device 760 based on the processed signal or data.

The transceiver 740 transmits the signal or data processed by the processor 710, to the host. The transceiver 740 periodically communicates with the host.

Thus, the treatment device 760 provides a corresponding remedy to the patient under a control of the processor 710.

The power device 770 provides operational power for each element, for example, the processor 710, the interface 720, the delta-sigma ADC 730, the transceiver 740, the memory 750, and the treatment device 760. The power device 770 is, for example, a rechargeable power device, a non-rechargeable power device, and a flexible power device. Thus, the power device 770 is any appropriate energy source that provides power in this example.

The examples of an ADC, in particular a delta-sigma ADC, may provide greater accuracy for an analog-to-digital conversion.

The image display apparatus described herein may be implemented using a liquid crystal display (LCD), a light-emitting diode (LED) display, a plasma display panel (PDP), a screen, a terminal, or any other type of display known to one of ordinary skill in the art. A screen may be a physical structure that includes one or more hardware components that provide the ability to render a user interface and receive user input. The screen may include any combination of a display region, a gesture capture region, a touch-sensitive display, and a configurable area. The screen may be part of an apparatus, or may be an external peripheral device that is attachable to and detachable from the apparatus. The display may be a single-screen display or a multi-screen display. A single physical screen may include multiple displays that are managed as separate logical displays permitting different content to be displayed on separate displays even though they are part of the same physical screen.

The user interface may provide the capability of inputting and outputting information regarding a user and an image. The user interface may include a network module for connecting to a network and a universal serial bus (USB) host module for forming a data transfer channel with a mobile storage medium. In addition, the user interface may include one or more input/output devices, such as a mouse, a keyboard, a touch screen, a monitor, a speaker, a screen, or a software module for controlling the input/output device.

The apparatuses, units, modules, devices, and other components illustrated in FIGS. 1-13 that perform the operations described herein with respect to FIGS. 1-13 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-13. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described herein with respect to FIGS. 1-13 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switched-capacitor integrator comprising:
   an amplifier comprising a first input terminal, a second input terminal, a first output terminal, and a second output terminal;
   a first integrating capacitor situated between the first input terminal and the first output terminal;
   a second integrating capacitor situated between the second input terminal and the second output terminal; and
   a switched-capacitor circuit configured to sample an input signal based on a control signal, and configured to integrate the input signal and a feedback signal using the first integrating capacitor and the second integrating capacitor based on the control signal.

2. The integrator of claim 1, wherein the first output terminal is configured to provide a non-inverted output signal from the integration of the input signal, and the second output terminal is configured to provide an inverted output signal from the integration of the input signal.

3. The integrator of claim 1, further comprising:
   a feedback circuit configured to generate the feedback signal by sampling a reference signal using a feedback capacitor, and to transfer the feedback signal into the switched-capacitor circuit.

4. The integrator of claim 3, wherein the reference signal comprises a non-inverted reference signal and an inverted reference signal, and the feedback circuit is configured to generate the feedback signal by sampling at least one of the non-inverted reference signal and the inverted reference signal based on the control signal.

5. The integrator of claim 3, wherein the feedback circuit comprises:
   a first feedback circuit configured to generate a first feedback signal based on the reference signal, and to transfer the first feedback signal into the first integrating capacitor; and
   a second feedback circuit configured to generate a second feedback signal based on the reference signal, and to transfer the second feedback signal into the second integrating capacitor.

6. The integrator of claim 3, wherein the control signal comprises a first control signal used to control the switched-capacitor circuit and a second control signal used to control the feedback circuit, and the second control signal is generated based on the first control signal.

7. The integrator of claim 6, wherein the first control signal is generated based on an output signal of the first output terminal and an output signal of the second output terminal.

8. The integrator of claim 1, wherein the switched-capacitor circuit comprises:
   a first sampling capacitor configured to integrate the input signal using the first integrating capacitor;
   a second sampling capacitor configured to integrate the input signal using the second integrating capacitor; and
   an array of switches controlled based on a clock phase of the control signal.

9. The integrator of claim 8, wherein the array of switches is controlled based on the clock phase such that the input signal is transmitted into at least one of the first sampling capacitor and the second sampling capacitor, and an output signal of the first sampling capacitor is integrated using the first integrating capacitor while the output signal of the first sampling capacitor is simultaneously integrated using the second integrating capacitor.

10. The integrator of claim 8, wherein the clock phase comprises:
    a first clock phase in which the input signal is sampled using the first sampling capacitor; and
    a second clock phase in which an output signal of the first sampling capacitor and an output signal of a first feedback capacitor are integrated using the first integrating capacitor, and an output signal of the second sampling capacitor and an output signal of a second feedback capacitor are integrated using the second integrating capacitor.

11. A delta-sigma modulator comprising:
    a digital-to-analog converter (DAC) configured to generate a feedback signal using a reference signal; and
    a switched-capacitor integrator configured to sample an input signal based on a control signal and integrate the feedback signal and the input signal based on the control signal, thereby generating a non-inverted integral signal and an inverted integral signal.

12. The modulator of claim 11, further comprising:
    a comparator configured to generate an L-bit digital bitstream based on the non-inverted integral signal and the inverted integral signal, wherein L is a natural number.

13. The modulator of claim 11, wherein the switched-capacitor integrator comprises:
    an amplifier comprising a first input terminal, a second input terminal, a first output terminal, and a second output terminal;
    a first integrating capacitor situated between the first input terminal and the first output terminal;
    a second integrating capacitor situated between the second input terminal and the second output terminal;
    a switched-capacitor circuit configured to sample the input signal based on the control signal, and configured to integrate the input signal and the feedback signal using the first integrating capacitor and the second integrating capacitor based on the control signal; and
    a feedback circuit configured to generate the feedback signal by sampling the reference signal using a feedback capacitor, and to transfer the feedback signal into the switched-capacitor circuit.

14. The modulator of claim 13, wherein the feedback signal comprises a non-inverted feedback signal and an inverted feedback signal, and the feedback circuit is configured to transfer at least one of the non-inverted feedback signal and the inverted feedback signal to the switched-capacitor circuit based on the control signal.

15. The modulator of claim 13, wherein the control signal comprises a first control signal used to control the switched-capacitor circuit and a second control signal used to control the feedback circuit, and the second control signal is generated based on the first control signal.

16. The modulator of claim 15, wherein the first control signal is generated based on an output signal output from the first output terminal and an output signal of the second output terminal.

17. The modulator of claim 13, wherein the switched-capacitor circuit comprises an array of switches controlled based on a clock phase of the control signal such that the input signal is transmitted into at least one of a first sampling capacitor and a second sampling capacitor, and an output signal of the first sampling capacitor is integrated using the first integrating capacitor while the output signal of the first sampling capacitor is simultaneously integrated using the second integrating capacitor.

18. An operation method of a switched-capacitor integrator, the method comprising:
sampling an input signal based on a clock phase of a control signal; and
generating a non-inverted integral signal and an inverted integral signal by differently integrating the input signal and a feedback signal using a same integrating capacitor in different integration intervals of the control signal.

19. An operation method of a delta-sigma modulator, the method comprising:
generating a feedback signal using a reference signal;
sampling an input signal based on a control signal; and
generating a non-inverted integral signal and an inverted integral signal by integrating the input signal and the feedback signal based on the control signal.

20. The method of claim 19, wherein the sampling and generating are performed based on a clock phase of the control signal.

21. The method of claim 19, wherein the generating the feedback signal comprises sampling a reference signal using a feedback capacitor.

22. The method of claim 21, wherein the reference signal comprises a non-inverted reference signal and an inverted reference signal, and the generating comprises sampling the feedback signal by sampling at least one of the non-inverted reference signal and the inverted reference signal based on the control signal.

23. The integrator of claim 1, wherein the switched-capacitor circuit is configured so the first integrating capacitor integrates, in a first integration interval implemented by the control signal, a difference between the input signal and a common voltage and integrates a first feedback signal.

24. The integrator of claim 23, wherein the first feedback signal represents a first difference between a first reference voltage and a second reference voltage, and the switched-capacitor circuit is configured so the second integrating capacitor integrates, in the first integration interval, another difference between the input signal and the common voltage and integrates a second feedback signal representing a second difference between the first reference voltage and the second reference voltage.

25. The integrator of claim 24, wherein the switched-capacitor circuit is configured so, in a second integration interval implemented by the control signal, the first integrating capacitor integrates at least the second feedback signal and the second integrating capacitor integrates at least the first feedback signal.

26. The integrator of claim 1, wherein the feedback signal represents differences between a first reference voltage and a second reference voltage, respectively depending on which of at least two integration intervals is being implemented by the switched-capacitor circuit based on the control signal.

27. The integrator of claim 26, wherein the switched-capacitor circuit is configured so, in a first integration interval implemented by the control signal, the first integrating capacitor integrates a first difference between the first reference voltage and the second reference voltage and the second integrating capacitor integrates a second difference between the first reference voltage and the second reference voltage, and so, in a second integration interval implemented by the control signal, the first integrating capacitor integrates the second difference and the second integrating capacitor integrates the first difference.

28. The integrator of claim 1, wherein the switched-capacitor circuit is configured to differently integrate the input signal and the feedback signal, using the first integrating capacitor and the second integrating capacitor, based on which of at least two integration intervals is being implemented by the switched-capacitor circuit.

29. The integrator of claim 28, wherein respective timings of the integration intervals are based on plural control signals derived from the control signal and an L-bit digital bitstream generated by a comparator provided a non-inverted integral signal and an inverted integral signal respectively provided at the first and second output terminals of the amplifier.

30. The integrator of claim 28, wherein the switched-capacitor circuit is configured to electrically connect the input signal to only a first sampling capacitor during a first phase of one of the integration intervals and configured to electrically connect the input signal to only a second sampling capacitor during a second phase of the one integration interval, wherein the first and second integrating capacitors integrate provided voltages during the second phase.

31. The integrator of claim 30, wherein the switched-capacitor circuit is configured to electrically connect a common voltage to the second integrating capacitor during the first phase and configured to electrically connect the common voltage to the first integrating capacitor during the second phase.

* * * * *